(12) United States Patent
Yamanaka et al.

(10) Patent No.: US 9,761,686 B2
(45) Date of Patent: Sep. 12, 2017

(54) SEMICONDUCTOR WAFER, METHOD OF PRODUCING SEMICONDUCTOR WAFER, AND HETEROJUNCTION BIPOLAR TRANSISTOR

(71) Applicant: SUMITOMO CHEMICAL COMPANY, LIMITED, Tokyo (JP)

(72) Inventors: Sadanori Yamanaka, Ibaraki (JP); Naohiro Nishikawa, Chiba (JP); Tsuyoshi Nakano, Ibaraki (JP)

(73) Assignee: SUMITOMO CHEMICAL COMPANY, LIMITED, Chuo-ku, Tokyo (JP)

( * ) Notice: Subject to any disclaimer, the term of this patent is extended or adjusted under 35 U.S.C. 154(b) by 0 days.

(21) Appl. No.: 15/187,016

(22) Filed: Jun. 20, 2016

(65) Prior Publication Data
US 2016/0372569 A1 Dec. 22, 2016

(30) Foreign Application Priority Data
Jun. 22, 2015 (JP) .................................. 2015-125191

(51) Int. Cl.
*H01L 21/00* (2006.01)
*H01L 29/00* (2006.01)
(Continued)

(52) U.S. Cl.
CPC .... *H01L 29/66318* (2013.01); *H01L 21/0262* (2013.01); *H01L 21/02395* (2013.01); *H01L 21/02461* (2013.01); *H01L 21/02463* (2013.01); *H01L 21/02505* (2013.01); *H01L 21/02546* (2013.01); *H01L 21/02576* (2013.01); *H01L 29/207* (2013.01); *H01L 29/7371* (2013.01)

(58) Field of Classification Search
CPC .......... H01L 21/02546; H01L 21/0262; H01L 21/02395; H01L 21/8552; H01L 29/66318; H01L 29/7371; H01L 29/207
See application file for complete search history.

(56) References Cited

U.S. PATENT DOCUMENTS 4,933,732 A * 6/1990 Katoh ................. H01L 29/7371
257/12

FOREIGN PATENT DOCUMENTS

JP 7-22327 A 1/1995
JP 7-321058 A 12/1995
JP 2007-189200 * 7/2007 .......... H01L 21/331

* cited by examiner

*Primary Examiner* — Nikolay Yushin
(74) *Attorney, Agent, or Firm* — Sughrue Mion, PLLC (57) ABSTRACT

Techniques are provided that can impart sufficient electrical conductivity to a semiconductor crystal exhibiting low doping efficiency for silicon atoms, such as InGaAs, by implanting only a small amount of silicon atoms. Such a semiconductor wafer may include a first semiconductor crystal layer, a second semiconductor crystal layer exhibiting a conductivity type that is different from the first layer, a third semiconductor crystal layer exhibiting the conductivity type of the first layer and having a larger band gap than the second semiconductor crystal layer, and a fourth semiconductor crystal layer exhibiting the conductivity type of the first layer and having a smaller band gap than the third semiconductor crystal layer. The fourth semiconductor crystal layer contains a first element that generates a first carrier of a corresponding conductivity type and a second element that generates a second carrier of a corresponding conductivity type.

6 Claims, 5 Drawing Sheets

(51) Int. Cl.
  *H01L 29/66* (2006.01)
  *H01L 29/737* (2006.01)
  *H01L 21/02* (2006.01)
  *H01L 29/207* (2006.01)

SEMICONDUCTOR WAFER, METHOD OF PRODUCING SEMICONDUCTOR WAFER, AND HETEROJUNCTION BIPOLAR TRANSISTOR

BACKGROUND

1. Technical Field

The present invention relates to a semiconductor wafer, a method of producing a semiconductor wafer and a heterojunction bipolar transistor.

2. Related Art

Group III-V compound semiconductor devices such as heterojunction bipolar transistors may have a connection region made of a semiconductor between the semiconductor region providing the operable region and the metal electrode to electrically connect them together. Such a semiconductor connection region preferably forms an ohmic contact with the metal electrode and has low contact resistance. In addition, the connection region itself preferably has low electrical resistance. For this reason, the semiconductor used to form the connection region is often a narrow band-gap semiconductor doped with a large amount of impurity atoms.

For example, when a heterojunction bipolar transistor has a collector made of n-type GaAs, a base made of p-type GaAs, an emitter made of n-type InGaP, and a sub-emitter made of n-type GaAs, a contact layer made of n-type InGaAs is formed between the emitter electrode made of metals and the sub-emitter as the above-described semiconductor connection region. Japanese Patent Application Publication No. 7-22327 discloses in Paragraphs [0002] to [0006] the problems caused by the use of the n-type InGaAs layer as the connection region and exemplary solutions for the problems.

Specifically speaking, Japanese Patent Application Publication No. 7-22327 discloses as follows.

"In the conventional art, . . . N$^+$-type In$_y$Ga$_{1-y}$As crystal layer 3 is further vapor-deposited on element body 2, which provides the operable region (the collector, base, emitter and the like), and the crystal layer 3 is used as a non-alloy resistance contact region . . . . The N$^+$-type In$_y$Ga$_{1-y}$As crystal layers 3 and 4 are typically formed by metal organic chemical vapor deposition (MOCVD). In this case, the dopant materials to be used typically include disilane (Si$_2$H$_6$) or monosilane (SiH$_4$)."

"When the N$^+$-type In$_y$Ga$_{1-y}$As crystal layer is used as a non-alloy resistance contact region . . . , the indium ratio y is typically at least set to 0.5 or higher. Here, in order to vapor-deposit InGaAs crystal layers having such an indium ratio, . . . the suitable temperature is 400° C. to 500° C., which is relatively low. On the other hand, the dopant materials of disilane and monosilane are highly efficiently implanted within a temperature range of 600° C. to 800° C., which is suitable for the vapor-deposition of GaAs crystal layers and AlGaAs layers, but significantly poorly implanted within the temperature range that is suitable for the vapor-deposition of InGaAs crystal layers."

"Therefore, in order to perform heavy doping targeting a concentration of approximately 5×10$^{19}$ cm$^{-3}$, which is required to form non-alloy resistance contact layer . . . , with the use of disilane or monosilane as the dopant materials within the temperature range of 400° C. to 500° C., which is suitable for the vapor-deposition of InGaAs crystal, the source gas need to be pumped into the growth chamber at the concentration that is 10 to 100 times as high as the concentration employed for the vapor-deposition of GaAs crystal and AlGaAs crystal. When the source gas is fed at such a high concentration, however, the dopant materials themselves and silicon resulting from thermal decomposition of the dopant materials contaminate the growth chamber. Thus, it is difficult to grow highly pure crystal.

"The present invention aims to manufacture compound semiconductor devices having improved performances and to prevent the contamination of the growth chamber used to manufacture the compound semiconductor devices, by utilizing dopant materials that can be highly efficiently implanted at temperatures suitable for vapor-deposition of InGaAs and InAs crystal layers."

"The above-described problems can be solved by using selenium as the dopant (donor impurity)."

"Selenium is a Group-VI element and serves as a donor impurity. In addition, selenium is always stable at relatively low temperatures suitable for vapor-deposition of InGaAs crystal layers or InAs crystal layers and the activation rate of selenium never degrades."

Japanese Patent Application Publication No. 7-321058 also discloses in claim 4 that selenium may be used as the n-type dopant in place of silicon.

As disclosed in Japanese Patent Application Publications Nos. 7-22327 and 7-321058, the use of Group-VI atoms such as selenium as the n-type dopant can allow the n-type impurity atoms to be implanted at high concentration into InGaAs, which inevitably requires to be grown at low temperatures.

When Group-VI atoms such as selenium are used as the n-type dopant for InGaAs, however, the Group-VI atoms such as selenium remain within the epitaxial growth chamber and may unfavorably contaminate a next semiconductor wafer while it is being manufactured. In addition, the Group-VI atoms such as selenium have higher diffusion coefficient in solids than silicon. The atoms such as selenium may diffuse into the underlying layers during the epitaxial growth and compromise the reliability of the devices to be manufactured with the layers.

For the above-described reasons, it is preferable to use silicon atoms in place of Group-VI atoms such as selenium, as the n-type dopant for InGaAs crystal. When silicon atoms are used as the dopant, however, sufficient electrical conductivity cannot be achieved unless a large amount of silicon atoms are implanted as disclosed in Japanese Patent Application Publication No. 7-22327. The implantation of a large amount of silicon atoms degrades the crystallinity of InGaAs crystal and thus is not preferable.

The objective of the present invention is to provide a technique that can impart sufficient electrical conductivity to semiconductor crystal exhibiting low doping efficiency for silicon atoms, such as InGaAs, by implanting only a small amount of silicon atoms. Another objective of the present invention is to provide a technique that can enhance the purity and crystallinity of semiconductor crystal by implanting a smaller amount of silicon atoms into the semiconductor crystal and thus provide n-type compound semiconductor crystal with low resistance and excellent crystallinity.

SUMMARY

To solve the above-described problems, a first aspect of the present invention is to provide a semiconductor wafer including: a first semiconductor crystal layer exhibiting a first conductivity type that is one of a p-type and an n-type; a second semiconductor crystal layer exhibiting a second conductivity type that is different from the first conductivity type; a third semiconductor crystal layer exhibiting the first conductivity type and having a larger band gap than the second semiconductor crystal layer; and a fourth semiconductor crystal layer exhibiting the first conductivity type and having a smaller band gap than the third semiconductor crystal layer. Here, the first semiconductor crystal layer, the second semiconductor crystal layer, the third semiconductor crystal layer and the fourth semiconductor crystal layer are arranged in an order of the first semiconductor crystal layer, the second semiconductor crystal layer, the third semiconductor crystal layer and the fourth semiconductor crystal layer, the fourth semiconductor crystal layer contains a first element that generates a first carrier corresponding to the first conductivity type and a second element that generates a second carrier corresponding to the second conductivity type, and the fourth semiconductor crystal layer has a carrier concentration of $1 \times 10^{19}$ [cm$^{-3}$] or higher and a mobility of 1000 [cm$^2$/Vs] or higher according to a Hall effect measurement.

The fourth semiconductor crystal layer may have a carrier concentration of $2 \times 10^{19}$ [cm$^{-3}$] or higher and a mobility of 1000 [cm$^2$/Vs] or higher according to a Hall effect measurement. The fourth semiconductor crystal layer may be an In$_x$Ga$_{1-x}$As layer (0<x<1) exhibiting n-type conductivity, preferably an In$_x$Ga$_{1-x}$As layer (0.4<x<0.8). In this case, the first element may be silicon, the second element may be carbon, and the ratio in concentration of carbon to silicon in the InGaAs layer may be 0.15 or lower, preferably 0.15 to 0.01, more preferably 0.1 to 0.01, most preferably 0.07 to 0.01. The fourth semiconductor crystal layer may be formed by means of MOCVD using a first source gas containing a Group-III element and the second element, a second source gas containing a Group-V element and a third source gas containing the first element. In this case, the fourth semiconductor crystal layer may be formed with a feed rate ratio of the third source gas to the first source gas set to 0.6 or lower, preferably 0.55 to 0.01.

A second aspect of the present invention is to provide a method of producing a semiconductor wafer, including sequentially epitaxially growing, on a wafer, a first semiconductor crystal layer exhibiting a first conductivity type that is one of a p-type and an n-type, a second semiconductor crystal layer exhibiting a second conductivity type that is different from the first conductivity type, a third semiconductor crystal layer exhibiting the first conductivity type and having a larger band gap than the second semiconductor crystal layer, and a fourth semiconductor crystal layer exhibiting the first conductivity type and having a smaller band gap than the third semiconductor crystal layer. Here, the fourth semiconductor crystal layer is formed by means of MOCVD using a first source gas containing a Group-III element and a second element, a second source gas containing a Group-V element and a third source gas containing a first element, the first element generates a first carrier corresponding to the first conductivity type and the second element generates a second carrier corresponding to the second conductivity type, and the fourth semiconductor crystal layer is formed with a feed rate ratio of the third source gas to the first source gas set to 0.6 or lower, preferably 0.55 to 0.01.

The fourth semiconductor crystal layer may be formed with a growth temperature set to 550° C. or lower. The first source gas may contain an In source gas containing In and a Ga source gas containing Ga. In this case, during the formation of the fourth semiconductor crystal layer, the feed rate ratio of the In source gas to the Ga source gas may be controlled so that the ratio x of In to Ga in the fourth semiconductor crystal layer is 0.4<x<0.8.

A third aspect of the present invention is to provide a heterojunction bipolar transistor including the above-described semiconductor wafer. The first semiconductor crystal layer is used as a collector layer, the second semiconductor crystal layer is used as a base layer, the third semiconductor crystal layer is used as an emitter layer, and the fourth semiconductor crystal layer is used as an emitter contact layer.

DESCRIPTION OF EXEMPLARY EMBODIMENTS

Figure 1:
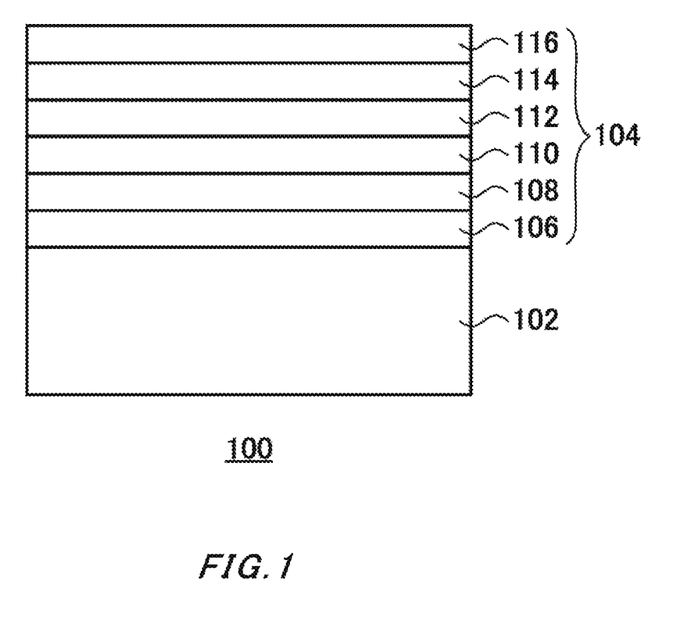
FIG. 1 is a cross-sectional view schematically showing a semiconductor wafer 100.

FIG. 1 is a cross-sectional view schematically showing a semiconductor wafer 100 relating to an embodiment of the present invention. The semiconductor wafer 100 is suitably used to manufacture a heterojunction bipolar transistor (HBT) and includes a support wafer 102 and a stack structure 104 that is made up by a plurality of compound semiconductor crystal layers formed on the support wafer 102.

The support wafer 102 is designed to support the stack structure 104 and is not particularly limited in terms of its shape, materials or the like, as long as the support wafer 102 has necessary levels of mechanical strength, chemical stability, and thermal stability to form the respective layers making up the stack structure 104. When the stack structure 104 is made up by GaAs-based compound semiconductor crystal layers, the support wafer 102 is preferably a semi-insulative GaAs wafer. In addition to a GaAs wafer, a silicon wafer, a germanium wafer or the like can be used as the support wafer 102.

The stack structure 104 includes a first connection layer 106, a first semiconductor crystal layer 108, a second semiconductor crystal layer 110, a third semiconductor crystal layer 112, a second connection layer 114 and a fourth semiconductor crystal layer 116. The first connection layer 106 is a semiconductor crystal layer heavily doped with impurity atoms and has the same conductivity type as the first semiconductor crystal layer 108. The first connection layer 106 is designed to establish electrical connection between the first semiconductor crystal layer 108 and electrodes to be later formed. The second connection layer 114 is a semiconductor crystal layer heavily doped with impurity atoms and has the same conductivity type as the third semiconductor crystal layer 112 and the fourth semiconductor crystal layer 116. The second connection layer 114 is designed to establish electrical connection between the third semiconductor crystal layer 112 and the fourth semiconductor crystal layer 116.

The first semiconductor crystal layer 108 exhibits a first conductivity type, which is one of the p-type and the n-type. The second semiconductor crystal layer 110 exhibits a second conductivity type that is different from the first conductivity type. The third semiconductor crystal layer 112 exhibits the first conductivity type and has a greater band gap than the second semiconductor crystal layer 110. The fourth semiconductor crystal layer 116 exhibits the first conductivity type and has a smaller band gap than the third semiconductor crystal layer 112. The first semiconductor crystal layer 108, the second semiconductor crystal layer 110, the third semiconductor crystal layer 112 and the fourth semiconductor crystal layer 116 are arranged in the order of the first semiconductor crystal layer 108, the second semiconductor crystal layer 110, the third semiconductor crystal layer 112 and the fourth semiconductor crystal layer 116 as shown in FIG. 1. The fourth semiconductor crystal layer 116 contains a first atom that generates a first carrier corresponding to the first conductivity type and a second atom that generates a second carrier corresponding to the second conductivity type, and the fourth semiconductor crystal layer 116 has a carrier concentration of $1\times10^{19}$ [cm$^{-3}$] or higher and mobility of 1000 [cm$^2$/Vs] or higher according to the Hall effect measurements. Preferably, the fourth semiconductor crystal layer has a carrier concentration of $2\times10^{19}$ [cm$^{-3}$] or higher and mobility of 1000 [cm$^2$/Vs] or higher according to the Hall effect measurements.

Figure 2:
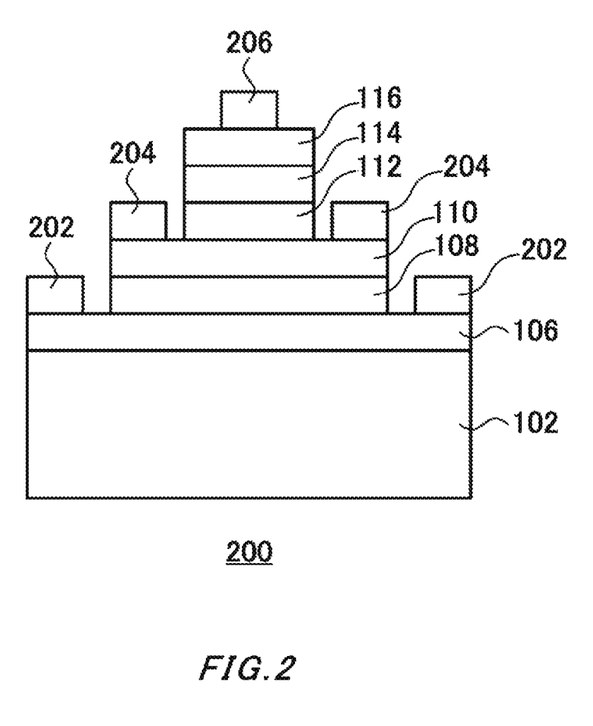
FIG. 2 is a cross-sectional view schematically showing a heterojunction bipolar transistor 200 manufactured using the semiconductor wafer 100.

FIG. 2 is a cross-sectional view schematically showing a heterojunction bipolar transistor 200 manufactured using the semiconductor wafer 100. As shown in FIG. 2, a first mesa structure made up by the first semiconductor crystal layer 108 and the second semiconductor crystal layer 110 is formed on the first connection layer 106, and a second mesa structure made up by the third semiconductor crystal layer 112, the second connection layer 114 and the fourth semiconductor crystal layer 116 is formed on the first mesa structure. After this, a collector electrode 202 is formed so as to be in contact with the first connection layer 106, and a base electrode 204 is formed so as to be in contact with the second semiconductor crystal layer 110. Furthermore, an emitter electrode 206 is formed so as to be in contact with the fourth semiconductor crystal layer 116.

In the case of the heterojunction bipolar transistor (HBT) 200 shown in FIG. 2, the first connection layer 106 serves as the sub-collector, the first semiconductor crystal layer 108 as the collector, the second semiconductor crystal layer 110 as the base, the third semiconductor crystal layer 112 as the emitter, the second connection layer 114 as the sub-emitter, and the fourth semiconductor crystal layer 116 as the emitter contact. When the first conductivity type is the n-type, the HBT 200 is of the npn-type. When the first conductivity type is the p-type, the HBT 200 is of the pnp type.

The HBT 200 is configured such that the band gap of the third semiconductor crystal layer 112 serving as the emitter is greater than the band gap of the second semiconductor crystal layer 110 serving as the base. In this manner, the diffusing current from the emitter to the base can be guided to flow into the collector without being lost in the base region, and the diffusing current from the base to the emitter can be blocked by the heterojunction of the valence band. Accordingly, the HBT 200 can achieve high-speed operation. In addition, the band gap of the fourth semiconductor crystal layer 116 serving as the emitter contact is smaller than the band gap of the third semiconductor crystal layer 112. In this way, lowered contact resistance is observed between the emitter electrode 206 and the fourth semiconductor crystal layer 116, and increased current density can be achieved for the current flowing from the emitter electrode 206.

As for the semiconductor wafer 100 of the present embodiment, the fourth semiconductor crystal layer 116 contains a first atom that generates a first-conductivity-type carrier and a second atom that generates a second-conductivity-type carrier, and the fourth semiconductor crystal layer 116 has a carrier concentration of $1\times10^{19}$ [cm$^{-3}$] or higher and mobility of 1000 [cm$^2$/Vs] or higher, preferably a carrier concentration of $2\times10^{19}$ [cm$^{-3}$] or higher and mobility of 1000 [cm$^2$/Vs] or higher, which are measured by means of the Hall effect measurements. Accordingly, the fourth semiconductor crystal layer 116 and the emitter electrode 206 form an ohmic contact, and the semiconductor wafer 100 can achieve lowered contact resistance and lowered resistance of the fourth semiconductor crystal layer 116.

The carrier concentration of $1\times10^{19}$ [cm$^{-3}$] or higher and the mobility of 1000 [cm$^2$/Vs] or higher of the fourth semiconductor crystal layer 116 can be achieved based on the following findings obtained by the inventors of the present invention from experiments and reviews.

In order that the fourth semiconductor crystal layer 116 may exhibit the first conductivity type, the fourth semiconductor crystal layer 116 needs to contain such an amount of first atoms that the carriers generated by the first atoms are more than offset by the carriers generated by the second atoms. In addition, the fourth semiconductor crystal layer 116 needs to be doped with a large amount of first atoms in order to achieve a carrier concentration (approximately $1\times10^{19}$ [cm$^{-3}$]) that is enough to lower the contact resistance between the fourth semiconductor crystal layer 116 and the emitter electrode 206 to a required level. Such requirements poses problems in relation to the heavy doping of silicon atoms when the fourth semiconductor crystal layer 116 is, for example, an InGaAs layer, as set forth in the section of the related art.

The inventors of the present invention have focused on the fact that the second atoms may offset the carriers and found that the amount of first atoms to be implanted can be reduced by reducing the amount of the second atoms to be implanted. In order to reduce the amount of the second atoms to be implanted, the fourth semiconductor crystal layer 116 may be grown at a higher rate. The fourth semiconductor crystal layer 116 can achieve enhanced purity and crystallinity by accomplishing lower concentrations of the first and second atoms. In this manner, the fourth semiconductor crystal layer 116 can achieve mobility of 1000 [cm$^2$/Vs] or higher while it is ensured that the fourth semiconductor crystal layer 116 achieves the necessary carrier concentration.

When the HBT 200 is of the npn-type, the fourth semiconductor crystal layer 116 can be, for example, an n-type In$_x$Ga$_{1-x}$As layer (0<x<1). In this case, the first atoms are silicon atoms and the second atoms are carbon atoms, for example. The ratio in concentration of the carbon atoms to the silicon atoms in the InGaAs layer can be 0.15 or lower, preferably 0.15 to 0.01, more preferably 0.1 to 0.01, most preferably 0.07 to 0.01. As described above, the carbon atoms, which are the second atoms, have a low concentration, and the ratio of the carbon atoms to the silicon atoms, which are the first atoms, is 0.15 or lower. When the fourth semiconductor crystal layer 116 is an n-type In$_x$Ga$_{1-x}$As layer (0<x<1), a carrier concentration of $1\times10^{19}$ [cm$^{-3}$] or higher and a mobility of 1000 [cm$^2$/Vs] or higher, preferably a carrier concentration of $2\times10^{19}$ [cm$^{-3}$] or higher and a mobility of 1000 [cm$^2$/Vs] or higher, can be achieved if the ratio in concentration of the carbon atoms, which are the second atoms, to the silicon atoms, which are the first atoms is 0.15 or lower.

When the fourth semiconductor crystal layer 116 is an n-type In$_x$Ga$_{1-x}$As layer (0.4<x<0.8), a carrier concentration of $1\times10^{19}$ [cm$^{-3}$] or higher and a mobility of 1000 [cm$^2$/Vs] or higher, preferably a carrier concentration of $2\times10^{19}$ [cm$^{-3}$] or higher and a mobility of 1000 [cm$^2$/Vs] or higher, can be also achieved. When the In ratio x is 0.4<x<0.8 or relatively high, the InGaAs layer suffers from poor crystallinity and experiences considerable surface roughness unless formed at a low temperature of 550° C. or lower. In the present embodiment, however, the fourth semiconductor crystal layer 116 can achieve a low carbon atom concentration even if grown at a low temperature of 550° C. or lower. Thus, the fourth semiconductor crystal layer 116 can achieve a mobility of 1000 [cm$^2$/Vs] or higher while it is ensured that the fourth semiconductor crystal layer 116 has a necessary carrier concentration. Accordingly, even when the In ratio x is 0.4<x<0.8, the fourth semiconductor crystal layer 116 of the present embodiment can achieve a carrier concentration of $1\times10^{19}$ [cm$^{-3}$] or higher and a mobility of 1000 [cm$^2$/Vs] or higher, preferably a carrier concentration of $2\times10^{19}$ [cm$^{-3}$] or higher and mobility of 1000 [cm$^2$/Vs] or higher without causing surface roughness.

For example, the first connection layer 106 is an n$^+$-type GaAs layer, the first semiconductor crystal layer 108 is an n-type GaAs layer, the second semiconductor crystal layer 110 is a p-type GaAs layer, the third semiconductor crystal layer 112 is an n-type InGaP layer, the second connection layer 114 is an n-type GaAs layer, and the fourth semiconductor crystal layer 116 is an n-type InGaAs layer.

The first connection layer 106, the first semiconductor crystal layer 108, the second semiconductor crystal layer 110, the third semiconductor crystal layer 112 and the second connection layer 114 can be formed using MOCVD (Metal Organic Chemical Vapor Deposition). The MOCVD technique can use as the source gas, for example, TMGa (trimethylgallium), TEGa (triethylgallium), TMIn (trimethylindium), AsH$_3$ (arsine), PH$_3$ (phosphine) or the like. The carrier gas can be hydrogen. A compound can be alternatively used that is obtained by replacing some of the hydrogen atom groups of the source gas with chlorine atoms or hydrocarbon groups. The reaction temperature can be selected as appropriate within the range of 300° C. to 900° C., preferably 400° C. to 800° C. The thickness can be controlled by appropriately selecting the amount of the source gas to be fed and the reaction duration.

Likewise, the fourth semiconductor crystal layer 116 cab be formed using MOCVD using a first source gas containing Group-III atoms and the second atoms, a second source gas containing Group-V atoms and a third source gas containing the first atoms. The formation of the fourth semiconductor crystal layer 116 is performed with the feed rate ratio of the third source gas to the first source gas set to 0.6 or lower, preferably 0.55 to 0.01. It should be noted that the first atoms generate the first carriers corresponding to the first conductivity type and that the second atoms generate the second carriers corresponding to the second conductivity type.

The first source gas can be TMGa, TEGa and TMIn. The second source gas can be AsH$_3$. When the first conductivity type is the n-type, the third source gas can be SiH$_4$ (silane) or Si$_2$H$_6$ (disilane). The first source gas contains carbon atoms that are to generate holes, which are the second carriers.

The carrier gas can be hydrogen. A compound can be alternatively used that is obtained by replacing some of the hydrogen atom groups of the source gas with chlorine atoms or hydrocarbon groups. The reaction temperature can be set 550° C. or lower. The In ratio can be controlled by regulating the ratio in fed amount between TMIn and one of TMGa and TEGa, which are the first source gas. The ratio in fed amount of the In source gas to the Ga source gas can be controlled such that the ratio x of the In atoms to the Ga atoms in the fourth semiconductor crystal layer 116 is 0.4<x<0.8. The thickness can be controlled by appropriately selecting the amount of the source gas to be fed and the reaction duration.

(Working Example)

A semiconductor wafer of a working example was manufactured by sequentially stacking, on a semi-insulative GaAs wafer (the support wafer 102), an n$^+$-type GaAs layer to serve as the sub-collector (the first connection layer 106), an n-type GaAs layer to serve as the collector (the first semiconductor crystal layer 108), a p-type GaAs layer to serve as the base (the second semiconductor crystal layer 110), an n-type InGaP layer to serve as the emitter (the third semiconductor crystal layer 112), an n-type GaAs layer to serve as the sub-emitter (the second connection layer 114) and an n-type InGaAs layer to serve as the emitter contact (the fourth semiconductor crystal layer 116). The n-type InGaP layer to serve as the emitter (the third semiconductor crystal layer 112) had a larger band gap than the p-type GaAs layer to serve as the base (the second semiconductor crystal layer 110). The n-type InGaAs layer to serve as the emitter contact (the fourth semiconductor crystal layer 116) had a smaller band gap than the n-type InGaP layer to serve as the emitter (the third semiconductor crystal layer 112).

The n-type InGaAs layer to serve as the emitter contact (the fourth semiconductor crystal layer 116) was formed using TEGa and TMIn as the Group-III source material, AsH$_3$ as the Group-V source material, and Si$_2$H$_6$ as the Group-IV source material. The growth temperature was appropriately selected within the range of 466° C. to 503° C. and a high growth rate was achieved by feeding a large amount of TMIn. The thickness was 250 nm.

As for the formation of the n-type InGaAs layer (the fourth semiconductor crystal layer 116), the feed rate ratio of the Group-IV source material to the Group-III source material (the IV/III ratio) was changed within the range of 0.07 to 0.51 to manufacture semiconductor wafers of first to fourth working examples. In addition, the In ratio was changed within the range of 0.5 to 0.68 to manufacture semiconductor wafers of fifth to eighth working examples. For the comparison purposes, the growth rate was lowered to 15.8 nm/min to 19.0 nm/min, and the IV/III ratio was changed within the range of 0.73 to 0.94 to manufacture semiconductor wafers of first to third comparative examples.

It should be noted that the IV/III ratio is defined based on the actual flow rates of the Group-IV source material and the Group-III source material as fed from the tanks or bubblers. The actual flow rate of the source material is calculated as (the gas concentration in the tank)×(the gas flow rate) when the source material is fed from the tank in the gaseous phase, or as (the carrier gas flow rate)×(the vapor pressure of the source material within the bubbler)/(the internal pressure within the bubbler) when the source material is fed through the bubbler. The gas flow rate and the carrier gas flow rate are controlled by a mass flow controller.

Tables 1 and 2 shows the measured values of the growth rate, electron concentration and mobility for the first to third comparative examples, the first to fourth working examples, and the fifth to eighth working examples. Table 2 additionally shows the measured values of the resistivity for the fifth to eighth working examples. Tables 1 and 2 also show the measured values of the ratio of the C atom concentration to the Si atom concentration (the C/Si ratio in concentration) for some of the working examples. Table 1 also shows the measured values for the first to third comparative examples. The electron concentration, mobility and resistivity were examined by means of the Hall effect measurement technique (the van der pauw method) using the ResiTest 8300 Hall Measurement system available from TOYO Corporation under the ASTM F76 standards. The C/Si ratio in concentration was examined by means of secondary ion mass spectrometry (SIMS). The In ratio was examined using the X-ray diffraction technique. In Tables 1 and 2, CE stands for a comparative example and WE stands for a working example.

TABLE 1

| | GROWTH RATE (nm/min) | IV/III RATIO (—) | ELECTRON CONCENTRATION (1/cm³) | MOBILITY (cm²/Vs) | C/Si CONCENTRATION RATIO (—) |
|---|---|---|---|---|---|
| CE1 | 19.0 | 0.73 | 2.4E+19 | 970 | — |
| CE2 | 15.8 | 0.79 | 2.5E+19 | 990 | 0.18 |
| CE3 | 18.7 | 0.94 | 2.5E+19 | 980 | — |
| WE1 | 27.1 | 0.07 | 1.2E+19 | 1,190 | — |
| WE2 | 27.6 | 0.26 | 2.5E+19 | 1,090 | 0.05 |
| WE3 | 25.9 | 0.41 | 2.5E+19 | 1,060 | — |
| WE4 | 28.3 | 0.51 | 1.9E+19 | 1,020 | — |

TABLE 2

| | GROWTH RATE (nm/min) | In RATIO (—) | ELECTRON CONCENTRATION (1/cm³) | MOBILITY (cm²/Vs) | RESISTIVITY (Ωcm) | C/Si CONCENTRATION RATIO (—) |
|---|---|---|---|---|---|---|
| WE5 | 25.7 | 0.50 | 2.5E+19 | 1,090 | 2.3E-04 | — |
| WE6 | 24.8 | 0.54 | 2.7E+19 | 1,050 | 2.2E-04 | — |
| WE7 | 25.3 | 0.57 | 3.0E+19 | 1,030 | 2.1E-04 | — |
| WE8 | 24.8 | 0.68 | 3.8E+19 | 1,000 | 1.6E-04 | 0.04 |

Figure 3:
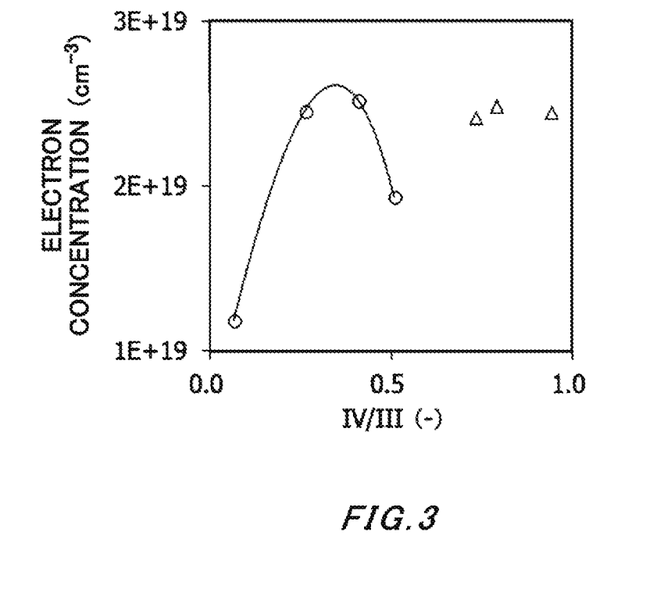
FIG. 3 shows a graph indicating how the electron concentration changes as the IV/III ratio changes.
Figure 4:
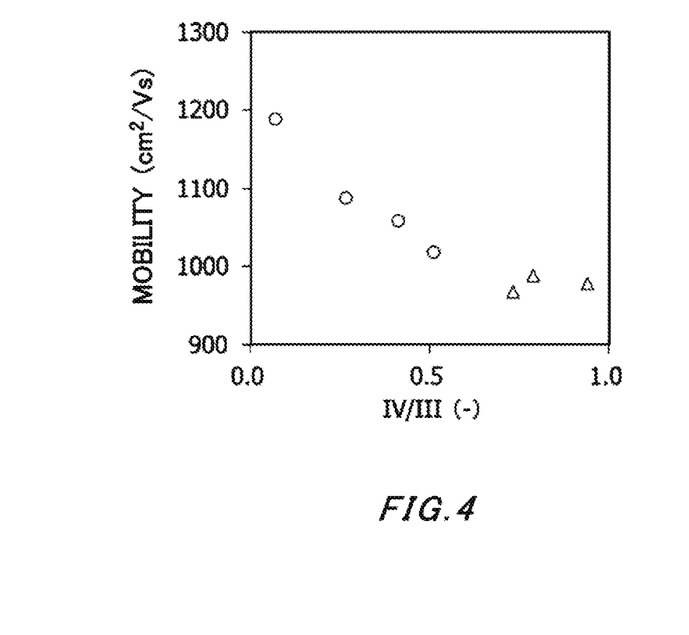
FIG. 4 shows a graph indicating how the mobility changes as the IV/III ratio changes.
Figure 5:
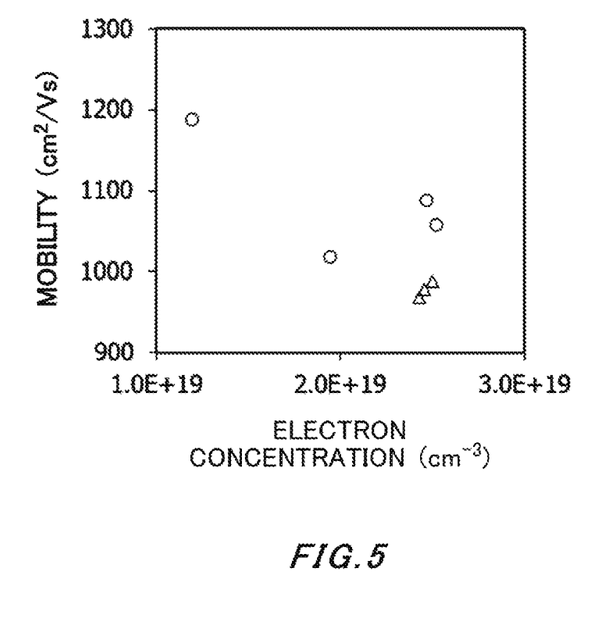
FIG. 5 shows the relation between the electron concentration and the mobility for various IV/III ratio values.
Figure 6:
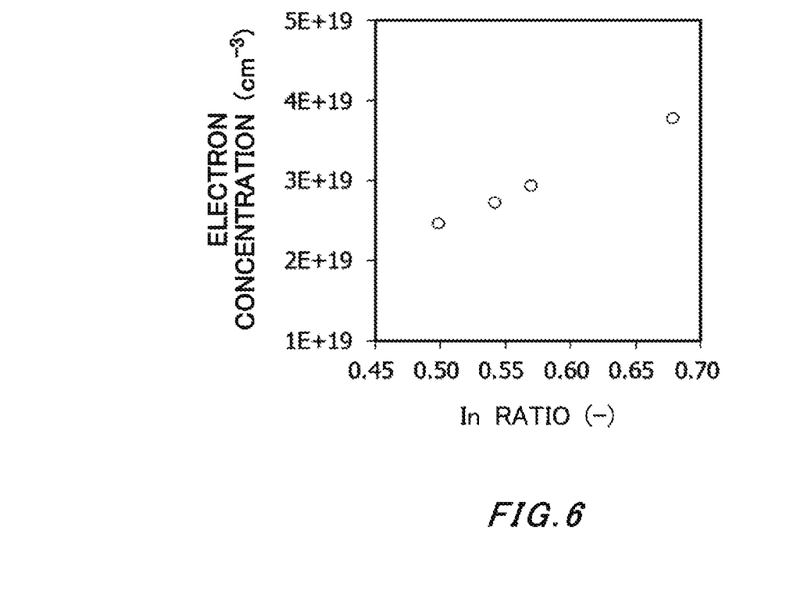
FIG. 6 shows a graph indicating how the electron concentration changes as the In ratio changes.
Figure 7:
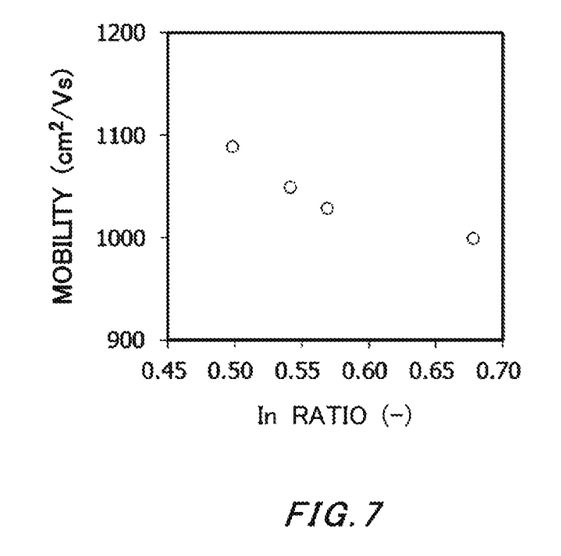
FIG. 7 shows a graph indicating how the mobility changes as the In ratio changes.
Figure 8:
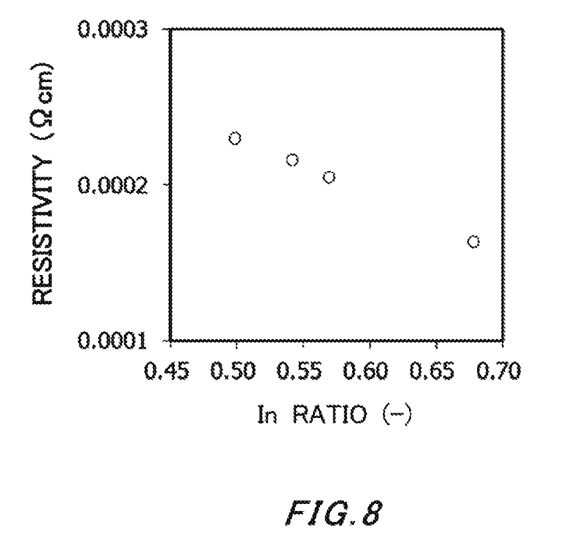
FIG. 8 shows a graph indicating how the resistivity changes as the In ratio changes.

FIG. 3 shows how the electron concentration changes as the IV/III ratio changes, and FIG. 4 shows how the mobility changes as the IV/III ratio changes. FIG. 5 shows the relation between the electron concentration and the mobility for various IV/III ratio values. FIG. 6 shows how the electron concentration changes as the In ratio changes, FIG. 7 shows how the mobility changes as the In ratio changes and FIG. 8 shows how the resistivity changes as the In ratio changes. In FIGS. 3 to 5, the triangles represent the data obtained for the first to third comparative examples.

Tables 1 and 2 reveal the following results. While the growth rate is 15.8 nm/min to 19.0 nm/min for the first to third comparative examples, a high growth rate of 24.8 nm/min or higher is achieved for the first to eighth working examples. While the C/Si ratio in concentration for the second comparative example is 0.18, a low C/Si ratio in concentration is observed for the second and eighth working examples, specifically speaking, 0.05 and 0.04 respectively. These results indicate that the increased growth rate can reduce the amount of carbon atoms. The growth rate can be increased by controlling the growth conditions for the MOCVD process. For example, when the crystal layer growth rate is limited by the surface reaction rate, the wafer temperature is raised to improve the surface reaction rate of the source gas, thereby increasing the growth rate. Alternatively, when the crystal layer growth rate is limited by the feed rate of the Group-III source material, the flow rate of the Group III source gas is raised to increase the feed rate of the Group III source material, thereby increasing the growth rate.

By reducing the amount of the carbon atoms, a sufficiently high electron concentration can be obtained even with the IV/III ratio set to 0.5 or lower as shown in FIG. 3. As long as FIG. 3 is concerned, the comparative examples (the triangles) can also achieve high electron concentration. However, the first to third comparative examples exhibit low mobility as seen from FIG. 4. As is apparent from the above, the first to fourth working examples achieve electron concentration that is not very different from the electron concentration achieved by the first to third comparative examples but accomplish considerably higher mobility. This is probably because the first to fourth working examples prevent the Si atoms from being implanted excessively and thus obtain a highly pure n-type InGaAs layer. FIG. 5 shows that the first to fourth working examples can achieve an electron concentration of $1 \times 10^{19}$ [cm$^{-3}$] or higher and a mobility of 1000 [cm²/Vs] or higher but the first to third comparative examples cannot achieve a mobility of 1000 [cm²/Vs] or higher.

FIGS. 6 to 8 show that an electron concentration of $2.5 \times 10^{19}$ [cm$^{-3}$] or higher a mobility of 1000 [cm²/Vs] or higher, and a resistivity of $2.3 \times 10^{-4}$ [Ωcm] or lower are achieved even if the In ratio is relatively high or 0.5 to 0.68.

DESCRIPTION OF REFERENCE NUMERALS

100 . . . semiconductor wafer, 102 . . . support wafer, 104 . . . stack structure, 106 . . . first connection layer, 108 . . . first semiconductor crystal layer, 110 . . . second semiconductor crystal layer, 112 . . . third semiconductor crystal layer, 114 . . . second connection layer, 116 . . . fourth semiconductor crystal layer, 200 . . . heterojunction bipolar transistor (HBT), 202 . . . collector electrode, 204 . . . base electrode, 206 . . . emitter electrode, x . . . In ratio

What is claimed is:

1. A semiconductor wafer comprising:
a first semiconductor crystal layer exhibiting a first conductivity type that is one of a p-type and an n-type;
a second semiconductor crystal layer exhibiting a second conductivity type that is different from the first conductivity type;
a third semiconductor crystal layer exhibiting the first conductivity type and having a larger band gap than the second semiconductor crystal layer; and
a fourth semiconductor crystal layer exhibiting the first conductivity type and having a smaller band gap than the third semiconductor crystal layer, wherein the first semiconductor crystal layer, the second semiconductor crystal layer, the third semiconductor crystal layer and the fourth semiconductor crystal layer are arranged in an order of the first semiconductor crystal layer, the second semiconductor crystal layer, the third semiconductor crystal layer and the fourth semiconductor crystal layer, the fourth semiconductor crystal layer contains a first element that generates a first carrier corresponding to the first conductivity type and a second element that generates a second carrier corresponding to the second conductivity type, the fourth semiconductor crystal layer has a carrier concentration of $1\times10^{19}$ [cm$^{-3}$] or higher and a mobility of 1000 [cm$^2$/Vs] or higher according to a Hall effect measurement, the fourth semiconductor crystal layer is an $In_xGa_{1-x}As$ layer (0.4<x<0.8) exhibiting n-type conductivity, the first element is silicon, the second element is carbon, and the ratio in concentration of carbon to silicon in the InGaAs layer is 0.15 or lower.

2. The semiconductor wafer according to claim 1, wherein the fourth semiconductor crystal layer has a carrier concentration of $2\times10^{19}$ [cm$^{-3}$] or higher and a mobility of 1000 [cm$^2$/Vs] or higher according to a Hall effect measurement.

3. A heterojunction bipolar transistor comprising the semiconductor wafer according to claim 1; wherein the first semiconductor crystal layer is used as a collector layer, the second semiconductor crystal layer is used as a base layer, the third semiconductor crystal layer is used as an emitter layer, and the fourth semiconductor crystal layer is used as an emitter contact layer.

4. A method of producing a semiconductor wafer, comprising sequentially epitaxially growing, on a wafer, a first semiconductor crystal layer exhibiting a first conductivity type that is one of a p-type and an n-type, a second semiconductor crystal layer exhibiting a second conductivity type that is different from the first conductivity type, a third semiconductor crystal layer exhibiting the first conductivity type and having a larger band gap than the second semiconductor crystal layer, and a fourth semiconductor crystal layer exhibiting the first conductivity type and having a smaller band gap than the third semiconductor crystal layer; wherein the fourth semiconductor crystal layer is formed by means of MOCVD using a first source gas containing a Group-III element and a second element, a second source gas containing a Group-V element and a third source gas containing a first element, the first element generates a first carrier corresponding to the first conductivity type and the second element generates a second carrier corresponding to the second conductivity type, and the fourth semiconductor crystal layer is formed with a feed rate ratio of the third source gas to the first source gas set to 0.6 or lower.

5. The method of producing a semiconductor wafer according to claim 4, wherein the fourth semiconductor crystal layer is formed with a growth temperature set to 550° C. or lower.

6. The method of producing a semiconductor wafer according to claim 4, wherein the first source gas contains an In source gas containing In and a Ga source gas containing Ga, during the formation of the fourth semiconductor crystal layer, the feed rate ratio of the In source gas to the Ga source gas is controlled so that the ratio x of In to Ga in the fourth semiconductor crystal layer is 0.4<x<0.8.

* * * * *